United States Patent

Freeburg et al.

Patent Number: 5,705,955
Date of Patent: Jan. 6, 1998

[54] FREQUENCY LOCKED-LOOP USING A MICROCONTROLLER AS A COMPARATOR

[75] Inventors: Thomas A. Freeburg, Arlington Heights; John Ley, McHenry; Anne M. Pearce, Barrington; Gary Schulz, Cary; Paul Odlyzko, Arlington Heights, all of Ill.

[73] Assignee: Motorola, Inc., Schaumburg, Ill.

[21] Appl. No.: 576,520

[22] Filed: Dec. 21, 1995

[51] Int. Cl.$^6$ .................. H03L 7/085; H03C 3/09; H04L 27/12
[52] U.S. Cl. .................. 331/14; 331/2; 331/17; 331/23; 331/25; 332/100; 332/127; 375/275; 375/307; 455/343
[58] Field of Search .................. 331/2, 14, 17, 331/25, 185, 23; 332/127, 128, 100–102; 455/343; 375/275, 307

[56] References Cited

U.S. PATENT DOCUMENTS

| | | | |
|---|---|---|---|
| 4,707,670 | 11/1987 | Dakin | 332/127 |
| 4,743,864 | 5/1988 | Nakagawa et al. | 331/14 |
| 4,906,944 | 3/1990 | Frerking | 331/25 |
| 5,041,798 | 8/1991 | Moorman et al. | 331/25 |
| 5,216,374 | 6/1993 | George et al. | 331/25 |

*Primary Examiner*—Siegfried H. Grimm
*Attorney, Agent, or Firm*—Kevin A. Buford

[57] ABSTRACT

A frequency-locked loop (100) employs a controllable oscillator (102) for generating an output signal having a frequency, optional sampler (104), coupled to oscillator (102), for sampling the frequency of the output signal, a divider (106), coupled to optional sampling circuit (104), for dividing the output signal frequency to generate a prescaled signal and a microprocessor (108), coupled between the divider 106 and oscillator (102), for comparing the prescaled signal to a reference signal and generating a control signal for correcting frequency shifts based upon the comparison. The control signal generated by microprocessor (108) is non-continuous. During that time when microprocessor (108) generates no control signals, power is removed from various frequency-locked loop circuitry.

5 Claims, 3 Drawing Sheets

FREQUENCY LOCKED-LOOP USING A MICROCONTROLLER AS A COMPARATOR

FIELD OF THE INVENTION

The present invention relates generally to communications systems and in particular to an apparatus and method for generating a stable frequency reference signal.

BACKGROUND OF THE INVENTION

Throughout the field of electronics, there is a continuing need for a low cost apparatus capable of providing a stable frequency reference signal. Additionally, low power consumption is an important factor in many applications. This is especially so, e.g., if the apparatus is employed within a small, portable, battery powered device such as, for example, a personal computer, radiotelephone, personal intelligent communicator (PIC) and the like. As will be appreciated, prior art solutions typically employ some form of phase or frequency locked loop circuitry in order to perform the desired frequency synthesis.

The typical phase-locked loop (PLL) circuit, while extremely stable, is nevertheless costly, due to the number of component parts required to complete assembly. Moreover, PLLs, sacrifice power in return for stability, by performing continuous phase correction of the frequency reference signal. As will be appreciated, phase correction is required in order to prevent reference signal phase shifts over time or temperature variations. In addition, continuous phase correction equates to a constant current drain upon system power resources. When system power resources comprise battery power, it will be appreciated that a constant current drain will only operate to shorten overall battery life.

In a similar fashion, the typical frequency-locked lccp (FLL) circuit, like the typical PLL circuit, practices continuous correction, albeit frequency correction. Despite this difference, continuous frequency correction still results in a constant current drain upon system power resources.

It would be extremely advantageous therefore to provide an apparatus capable of generating a stable frequency reference signal which overcomes the shortcomings of the prior art.

DETAILED DESCRIPTION OF A PREFERRED EMBODIMENT

Figure 1:
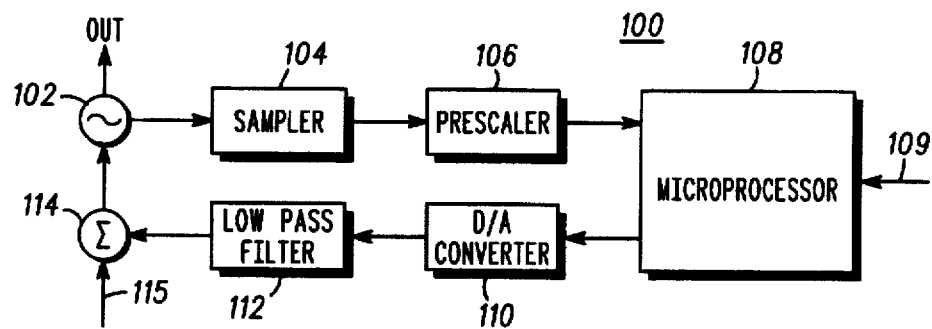
FIG. 1 is a block diagram representation of an embodiment of a frequency-locked loop circuit in accordance with the present invention.

Before describing a detailed embodiment of the present invention, it is believed that an overview will aid in the reader's understanding. Advantageously, the present invention does provide an inexpensive, low power frequency synthesis apparatus capable of generating a stable frequency reference signal. A more general embodiment yielding such advantageous results is shown in FIG. 1, which is a generalized block diagram representation of reference generating circuitry, e.g., a frequency-locked loop (FLL) circuit 100. As depicted, FLL 100 comprises a controllable oscillator 102, sampler/sampling circuit 104, divider circuit 106 also referred to as a prescaler, a microprocessor 108, digital-to-analog (D/A) converter 110, filter 112 and a summer/summing circuit 114.

Preferably, controllable oscillator 102 is a voltage controlled oscillator (VCO) like those known and readily available in the art. It will be further appreciated that oscillator 102 may comprise a numerically controlled oscillator, an oscillating crystal, or any other controllable frequency source.

Sampling circuit 104 is preferably a passive device, such as, for example a resistive power divider or a micro-strip power splitter, Notwithstanding, the passive device preference, sampling circuit 104 has a range of equivalent components including, but not limited to amplifiers, sample-and-hold circuits, analog-to-digital (A/D) converters and/or any other device capable of sampling or measuring oscillator 102 outputs.

Divider circuit 106 is preferably a prescaler circuit like those known in the art and in the past available by contacting Motorola Inc., at 1303 East Algonquin Road Schaumburg Ill. 60195. In addition, divider circuit 106 may comprise a counter, such as for example a divide-by-n counter or any other device capable of taking the sampled frequency and frequency dividing or scaling the sampled signal to a lower frequency signal.

Microprocessor 108 is a general purpose microprocessor, and D/A converter 110, low pass filter 112 and summing circuit 114 are similarly well known in the art and therefore require no additional discussion.

In operation, FLL 100 is a low power, low cost frequency synthesizer that generates a stable frequency signal that is adjustable despite frequency drifts due to time and/or temperature. As previously mentioned, FLL 100 employs a controllable oscillator 102. As is typical, a controllable oscillator's output is somewhat unstable and will tend to drift over time and/or temperature. In order to compensate for this instability, sampler 104 samples the oscillator 102 output frequency and passes the sampled frequency to divider circuit 106. Divider circuit 106 takes the sampled frequency and divides it down to a lower frequency signal.

By way of example, and not by way of limitation, assume that the sampled frequency is 2.0 Gigahertz (GHz) and divider 106 is a divide-by-64 prescaler. In this case, the divider 106 output will be a signal having a frequency of 31.25 Megahertz (MHz).

It is worth noting that divider 106 is optional. Where the sampled signal has a frequency that approximates the frequency of microprocessor clock reference 109, divider 106 is not required. In those instances where the sampled frequency substantially exceeds the microprocessor's clock reference 109, as in the above example, a divider circuit 106 is suggested.

As is known, clock reference 109 may be internal to microprocessor 108 or may be generated by an external source.

Microprocessor 108, under the direction and control of a program instruction set (stored in microprocessor memory (not shown)), preferably compares either the sampled signal to clock reference 109, when no divider is employed, or compares the prescaled signal to clock reference 109, when a divider is employed, in order to determine a difference (i.e., error signal). Thereafter, microprocessor 108 calculates an adjustment amount necessary to drive oscillator 102 back onto the desired frequency.

The adjustment amount is represented as a digital control signal that is generated by microprocessor 108 and communicated to D/A converter 110. D/A converter 110 converts the control signal to an analog signal for communication to oscillator 102. While depicted as a separate stand alone entity, it will be appreciated by those skilled in the art that D/A converter 110 may be incorporated within microprocessor 108 without departing from the spirit of the present invention. It will be further appreciated that D/A converter 110 may be substituted by a pulse width modulator (PWM) or any other such suitable replacement for D/A converter 110, the term converter encompassing all such functionally similar circuitry.

From D/A converter 110, the analog control signal is first filtered by low pass filter 112 to remove undesired components. Next, the filtered control signal is communicated to optional summing circuit 114. Summing circuit 114 is used in those instances when it is desired to inject an external modulation signal 115 into the loop 100. Such an instance may arise, for example, when the signal generated by FLL 100 is used to facilitate the transmission of information and/or data. In accordance, modulation signal 115 provides the modulation format to be used during transmission. When the signal generated by FLL 100 is intended for other purposes, modulation signal 115 is either removed from the summing circuit 114 or summing circuit 114 is simply not employed.

Referring back to sampling circuit 104, it will be appreciated by those skilled in the art that this device may be an active component. When sampling circuit 104 is active, such as for example when it is implemented as an amplifier, or sample-and-hold circuit, power savings can be attained by removing power from said active component during those intervals when frequency correction is not being performed by microprocessor 108. Similar power savings can also be attained by removing power from divider circuitry 106 during those intervals when frequency correction is not being performed by microprocessor 108.

Based upon the foregoing, it should be apparent that frequency correction as taught by the present invention is non-continuous. Moreover, during those times when frequency correction is not being performed, power is advantageously saved by removing power from various loop components such as, for example, optional sampling circuit 104 and divider circuit 106. All told, a significant improvement over prior art approaches can thus be achieved.

Figure 2:
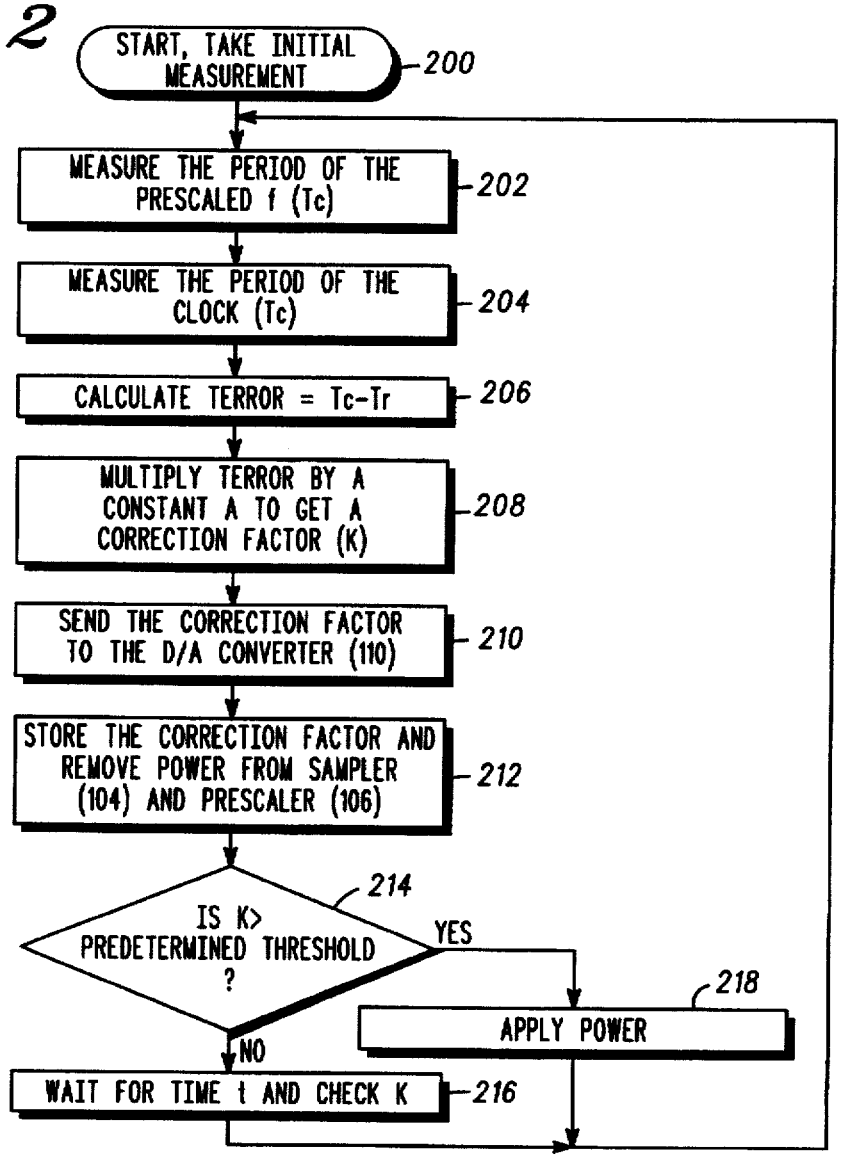
FIG. 2 is a flow chart diagram depicting the steps performed by the microprocessor of FIG. 1 during frequency correction in accordance with the present invention.

FIG. 2 is a flow chart diagram depicting the steps performed by the microprocessor of FIG. 1 during frequency correction in accordance with the present invention. Commencing with start block 200, flow proceeds to block 202 where the period, $T_f$, associated with the frequency of the reference signal generated by controllable oscillator 102 is measured. Where optional divider circuit 106 is employed, the period associated with the frequency of the prescaled signal output from divider 106 is measured at block 202. From block 202, flow proceeds to block 204 where the period, $T_c$, associated with the frequency of microprocessor clock reference signal 109 is measured. From block 204, flow proceeds to block 206 where the difference $T_{err}$ between $T_c$ and $T_f$ is determined. It will be appreciated by those skilled in the art that $T_{err}$ is a value representative of the frequency error between $T_c$ and $T_f$. At block 208 $T_{err}$ is multiplied by a constant A, where A is defined as a correction coefficient in order to obtain the correction factor (K) needed to adjust the reference frequency; a common example of such a correction coefficient is a temperature correction coefficient.

The output of block 208 is the digital control signal that is applied to D/A converter 110 at block 210 prior to delivery to controllable oscillator 102 of FIG. 1. At block 212 the correction factor is stored and power is removed from the sampler 104 and the prescaler 106. Optionally, at block 212 microprocessor 108 can be turned off when a timer is set to wake it up. At block 214 the correction factor K is compared to a predetermined threshold in order to determine how rapidly the reference oscillator 102 is changing frequency. At block 216 if the correction factor is smaller than or equal to the predetermined threshold the microprocessor 108 detects that the reference oscillator 102 changing at a slower rate therefore the interval between applying power and sampling are governed by a wait time $T_d$. It will be appreciated by those skilled in the art that $T_d$ is determined by the degree the oscillators drift which varies based on the type of manufacturer of the controllable oscillator. At block 218 if the correction factor is greater that the predetermined threshold wait time Td is negligibly small therefore, power is immediately applied and the flow returns to block 202 where another sample is taken.

It will be further appreciated by those skilled in the art that A is dependent on the type of controllable oscillator used and the empirical methodologies used to obtain A are well known in the art, one such example of which is Frequency Control Products, Handbook For The Design And Component Engineer, published by Piezo Technology, Inc. P.O. Box 547859, Orlando, Fla. 32854.

Figure 3:
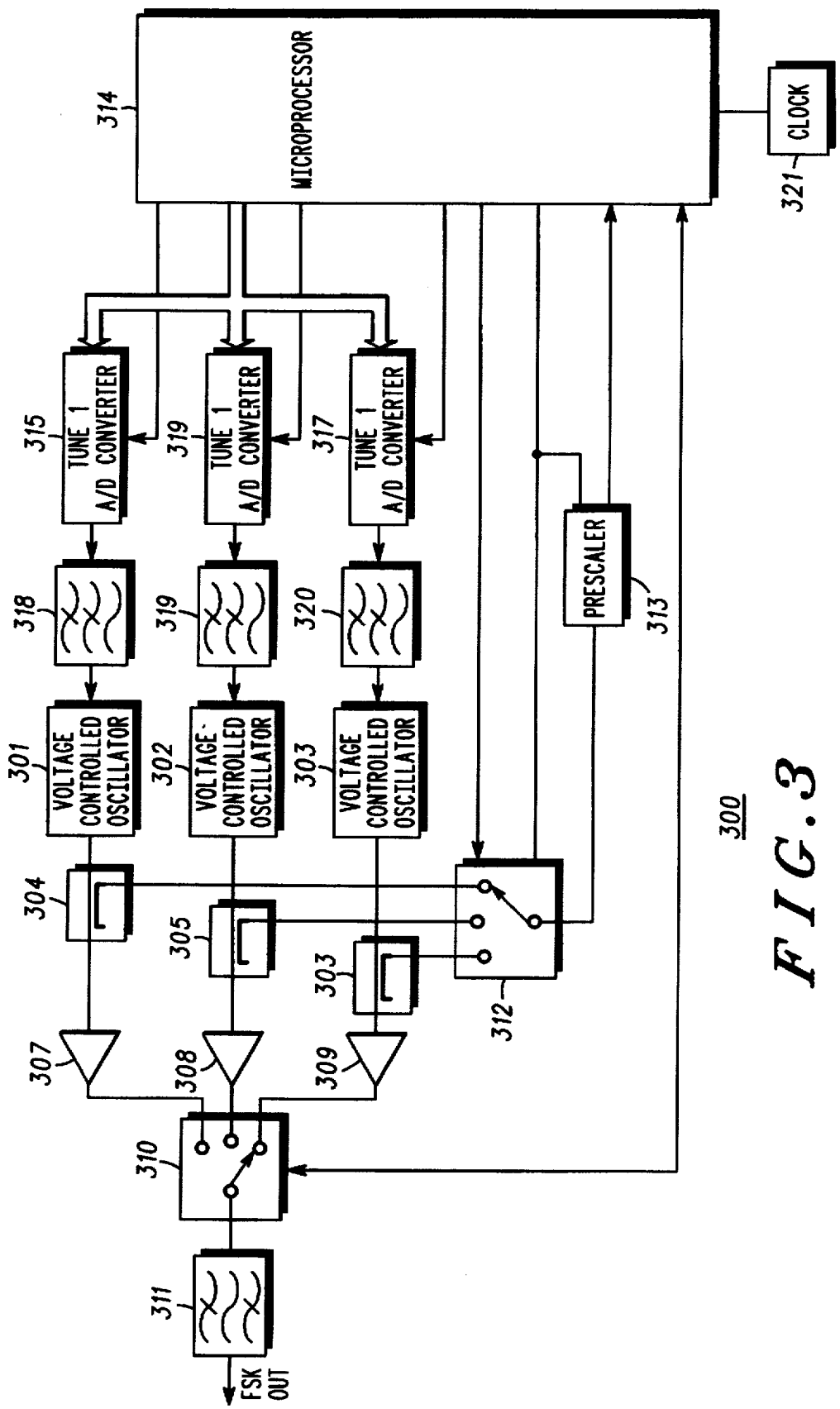
FIG. 3 is a block diagram representation of yet another embodiment of a frequency-locked lccp circuit in accordance with the present invention.

FIG. 3 is a block diagram representation of an embodiment of a frequency-locked loop 300 in accordance with the present invention. As depicted, FLL 300 comprises a plurality of controllable oscillators 301, 302, 303, sampling circuits 304 305 306, a plurality of buffer circuits 307, 308, 309, a divider circuit 313 also referred to as a prescaler, a microprocessor 314, a plurality of digital-to-analog (D/A) converters 315 316 317, a plurality of filters 318, 319, 320, a non-reflective switching circuit 310, which is preferably a single pole triple throw, a switching circuit 312, a bandpass filter 311 and a reference clock oscillator 321.

In this embodiment an FSK signal is generated by alternately selecting the output of the VCO 301, 302, 303 according to the data sent. This selection is done by using the non-reflective switch 310. During received mode the non-reflective switch 310 selects one of the VCO 301, 302, 303. In this case, bandpass filter 311 coupled to the non-reflective switch 311 is used to filter out the harmonics and narrow the signal.

In accordance with the preferred embodiment, controllable oscillators 301, 302, 303 are voltage controlled oscillators (VCOs) like those known and readily available in the art. It will be further appreciated that oscillators 301, 302, 303 may comprise a numerically controlled oscillator, an oscillating crystal, or any other controllable frequency source.

Sampling circuits 304–306 are preferably passive devices, such as, for example resistive power dividers or micro-strip power splitter/couplers. Notwithstanding, the passive device preference, sampling circuits 304–306 have a range of equivalent components including, but not limited to amplifiers, sample-and-hold circuits, analog-to-digital (A/D) converters and/or any other device capable of sampling or measuring the outputs of oscillators 301–303.

Divider circuit 313 is preferably a prescaler circuit like those known in the art. In addition, divider circuit 313 may comprise a counter, such as, e.g., a divide-by-n counter or any other device capable of taking the sampled frequency and dividing or scaling the sampled frequency to a lower frequency signal.

Microprocessor 314 is a general purpose microprocessor. D/A converters 315–317, low pass filters 318–320, buffers 307–309, bandpass filter 311, non-reflective switching circuit 310, and switching circuit 312 are similarly well known in the art.

In operation, FLL 300 is a low power, low cost frequency synthesizer that generates a stable frequency signal that is adjustable despite frequency drifts due to time and/or temperature. As previously mentioned, FLL 300 preferably employs three controllable oscillators 301–303 that operate to generate three output signals, the first output signal having a frequency that is associated with a logic high, the second output signal having a frequency that is associated with a logic low and the third output signal having a frequency that provides a local oscillator.

As is typical, a controllable oscillator's output is somewhat unstable and will tend to drift over time and/or temperature. In order to compensate for this instability, sampling circuits 304–306 sample the frequency of each of the plurality of output signals from the respective oscillators 301–303. The sampled signal whose amplitude is some small fraction of the total VCO output power, approximately 10 dB or less, is applied to one of the inputs of the non-reflective switching circuit 312. The action of this switching circuit 312 is to select one of the plurality of output signals generated by VCOs 301–303, and alternately route one of three sampled VCO output signals to a frequency divider circuit 313. The switching circuit 312 has switch position select data lines that are under the control of the microprocessor 314. A program running in the CPU determines the appropriate timing for the rate and dwell of the switch position. During times when sampling is not required, the microprocessor 314 sends a shutdown command to the switching circuit 312, thus removing its bias and reducing overall power consumption.

The output signal from the switching circuit 312 is provided to the divider circuit 313. The action of buffer circuits 307–309, in combination with the divider circuit 313 is twofold. The buffer circuits 307–309 are used to isolate the output of the VCOs 301–303 from the prescaler, the load pull phenomenon being thus reduced, and the divider circuit 313 acts to frequency divide the selected output signal, applied from the switch by some integer value, to generate a prescaled signal. Under the direction of the software running in the CPU, power resources are removed from a portion of the FLL, e.g., here power is removed from the switching circuit 312 when sampling circuits 304–306 are not active. The low frequency divided down output signal from divider circuit 313 is then provided as an input to the microprocessor 314.

Figure 4:
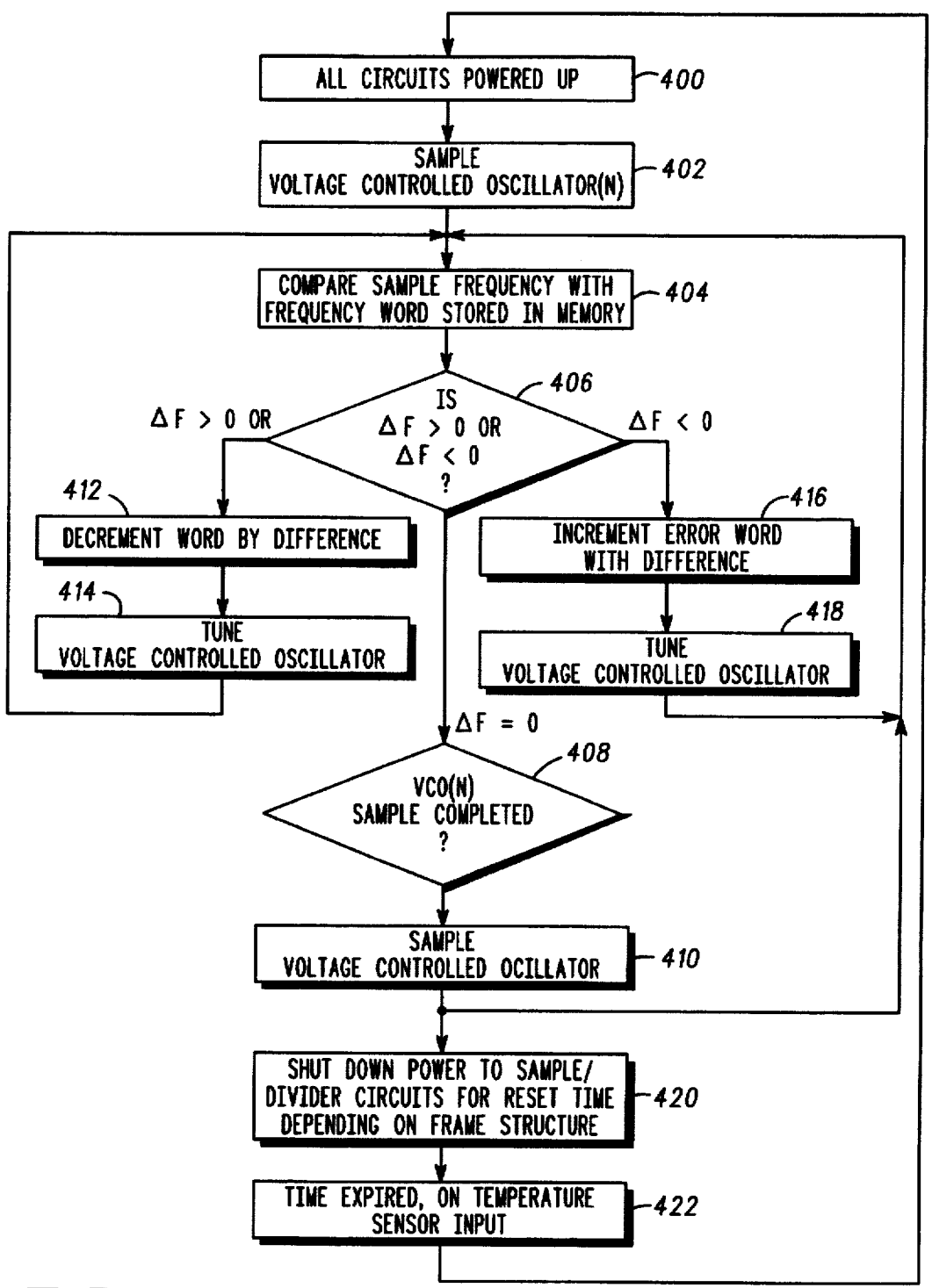
FIG. 4 is a flow chart diagram depicting the steps performed by the microprocessor of FIG. 3 during frequency correction in accordance with the present invention.

FIG. 4 is a flow chart diagram depicting the steps performed by the microprocessor of FIG. 3 during frequency correction in accordance with the present invention. Beginning with block 400 all circuits are initially powered-up in the FLL circuit. At block 402 the selected VCO(s) 301–303 are sampled and the divided down signal coming from the selected VCO 301, 302 or 303 is used as a timing gate for counting of clock pulses from the reference clock oscillator 321. The number of clock pulses counted during the interval between pulses from the divider circuit 313 is inversely proportional to the frequency of the selected VCO 301, 302 or 303. The number generated from this counting process is then used by the software algorithm running in the CPU, as a number that is proportional to the frequency of the VCO. At block 406, this number is then compared with a number stored in the CPU's memory, which number is representative of the desired frequency that the selected VCO 301, 302 or 303 should be at during the active sampling interval. At block 408, if the difference between these two numbers is within a predetermined threshold representing an acceptable frequency offset, then no further corrective action is taken by the microprocessor 314 and the flow proceeds to block 410 to determine if the VCOs 301–303 have been sampled. At block 410 if all VCOs have not been sampled, the next VCO (e.g., VCO 302 if following the sampling of VCO 301), is sampled, preferably sequentially, and the process recycled back through the comparison algorithm at block 404.

At block 412, if the number that represents the frequency of the selected VCO 301, 302 or 303 is found to be above the reference value stored in microprocessor memory, the microprocessor 314 under the direction and control of a program instruction set, will produce an error number which is proportional to the frequency offset. This error number is then applied as an N bit word to the appropriate D/A converter 315, 316 or 317, which is used to convert the N bit error signal to a proportional analog voltage. This analog voltage is low pass filtered via the chosen low pass filter circuit 318, 319 or 320, to remove noise and high frequency sampling artifacts, and is further applied as the controlling voltage to the input of the selected VCO, which is generating the prescaled signal being sampled. In this case since the sampled frequency is too high, the action of the controlling voltage generated by the error number calculated in the CPU would be to lower the frequency, thus reducing the error number to zero and tuning the VCO 301 at block 414 accordingly. At block 406, if the sampled frequency of the selected VCO output signal was too low, at block 416, the action of the algorithm would be to generate an N bit word that drives the prescaled signal of the associated D/A converter 315, 316 or 317 so that the higher voltage would be generated. The action of applying a higher voltage to the input of the selected VCO would be to drive its output frequency higher, thereby causing the error signal generated by the CPU to again become zero and tuning the VCO accordingly at block 418. At block 420, the power is removed from sampling circuits and dividing circuits for a predetermined time. At block 422 if the allotted time has expired the process returns to step 400 in the flow. At block 422, if the allotted time has not expired the power remains shut down on the FLL circuitry as previously described.

A skilled artisan will appreciate that in those instances, as described in the flow above, where the sampled frequency substantially varies from the microprocessor's clock reference 321, the microprocessor 314 preferably compares the prescaled signal to a reference signal and generates a non-continuous control signal for correcting a controllable oscillator's frequency based upon the comparison.

The VCO oscillators 301–303 are sequentially sampled and adjusted so that their operating frequencies match the corresponding frequency that is stored in the microprocessor's memory. This process will be done in a synchronous manner so that only inactive times will be used to do the adjustments, thus not affecting radio throughput. Between sampling times the switching circuit 312 and divider circuit 313 can be shut down, saving a substantial amount of power.

A further alternative, for example, is to monitor the ambient temperature, since the operating frequency of each VCO is subject to change when there is a change in temperature. This could be used to control the rate at which sampling must occur, thus improving power consumption further when the unit is operated in a temperature stable environment.

As is known, reference clock oscillator 321 may be internal to microprocessor 314, or may be generated by an external source.

One skilled in the art will appreciate that there are many variations that are possible for the present invention, only a limited number of which have been described in detail above. Thus, for example, while the embodiments above describe processor 314, VCOs 301–303, prescalar 313, etc., and other circuits, in terms of specific logical/functional/circuitry relationships, one skilled in the art will appreciate that such may be implemented in a variety of ways, e.g., by appropriately configured and programmed processors, ASICs (application specific integrated circuits), and DSPs (digital signal processors), but also by hardware components, some combination thereof, or even a distributed architecture with individual elements physically separated but cooperating to achieve the same functionality. Thus, it should be understood that the invention is not limited by the foregoing description of preferred embodiments, but embraces all such alterations, modifications, and variations in accordance with the spirit and scope of the appended claims.

What we claim is:

1. A frequency-locked loop comprising:
    a controllable oscillator for generating an output signal having a frequency the controllable oscillator having an input receiving a modulation signal in a transmission mode;
    a sampler, coupled to the controllable oscillator, for sampling the frequency of the output signal;
    a divider, coupled to the sampler, for dividing the frequency of the output signal to generate a prescaled signal;
    a microprocessor, coupled to the divider and the controllable oscillator, for performing a comparison of the prescaled signal to a reference signal and generating a non-continuous signal for correcting the frequency of the controllable oscillator output signal when not in the transmission mode, the microprocessor having instructions stored therein which control sampling by the sampler;
    a converter coupled to the microprocessor for converting the non-continuous control signal to an analog signal;
    a low pass filter coupled to the converter for filtering undesired components from the analog signal; and
    a summer coupled between the low pass filter and the controllable oscillator in order to provide for injection of the modulation signal.

2. The frequency-locked loop of claim 1, wherein the converter is one of a group consisting of a digital-to-analog converter and a pulse width modulator, the low-pass filter and converter together being operable for converting non-continuous control signals to analog signals for delivery to the controllable oscillator.

3. The frequency-locked loop of claim 1 wherein power resources are removed from the divider when the microprocessor is not generating control signals for communication to the controllable oscillator while continuing to provide the reference signal from a reference signal source.

4. The frequency-locked loop of claim 1 wherein power resources are removed from the sampler when the microprocessor is not generating control signals for communication to the controllable oscillator while continuing to provide the reference signal from a reference signal source.

5. A method for conserving power resources in a transmission circuit, comprising the steps of:
    generating an output signal having a variable frequency;
    performing, when in a non-transmission mode of operation, a comparison in a microprocessor of a prescaled signal, derived from the output signal, to a reference signal having a frequency, where the reference signal is a clock signal for the microprocessor;
    generating a non-continuous control signal for frequency adjusting the output signal based upon the comparison;
    operating in a transmission mode; and
    removing power resources from at least a portion of the transmission circuit when no control signal is being generated while continuing to provide the reference signal.

* * * * *